United States Patent [19]
Watanabe

[11] Patent Number: 6,085,408
[45] Date of Patent: Jul. 11, 2000

[54] PART MOUNTING DEVICE, PART MOUNTING METHOD, AND STORAGE MEDIUM STORING PROGRAM THEREOF

[75] Inventor: Michishi Watanabe, Yamagata, Japan

[73] Assignee: Yamagata Casio Co., Ltd., Yamagata, Japan

[21] Appl. No.: 09/104,578

[22] Filed: Jun. 25, 1998

[30] Foreign Application Priority Data

Aug. 1, 1997 [JP] Japan ................................... 9-208113

[51] Int. Cl.[7] ............................................. B23P 21/00
[52] U.S. Cl. ................................. 29/720; 29/721; 29/833
[58] Field of Search .............................. 29/701, 430, 720, 29/833, 740, 721

[56] References Cited

U.S. PATENT DOCUMENTS

| | | | |
|---|---|---|---|
| 5,329,690 | 7/1994 | Tsuji et al. | 29/720 X |
| 5,586,387 | 12/1996 | Nakatoni et al. | 29/720 X |
| 5,839,186 | 11/1998 | Onodera | 29/720 |

FOREIGN PATENT DOCUMENTS

| | | | |
|---|---|---|---|
| 5-167295 | 7/1993 | Japan | 29/720 |
| 5-342335 | 12/1993 | Japan . | |
| 6-21686 | 1/1994 | Japan | 29/720 |
| 6-61693 | 3/1994 | Japan | 29/720 |
| 7-44358 | 5/1995 | Japan . | |
| 7-44359 | 5/1995 | Japan . | |

*Primary Examiner*—Carl J. Arbes
*Attorney, Agent, or Firm*—Frishauf, Holtz, Goodman, Langer & Chick, P.C.

[57] ABSTRACT

A part mounting device for efficiently mounting parts on a multi-sectional board, a mounting method and a storage medium storing a program thereof. In a part mounting process, a nozzle A picking up part A and a nozzle B picking up part B are respectively attached to working heads "a" and "b" based on a mounting pattern read from a parameter table to a memory. The parts A and B are mounted in respective positions A and B of a first childboard according to the mounting pattern. Furthermore, the parts A and B are sequentially mounted on second, third, and fourth childboards by referencing their offset values. After it is determined that there is no other part which can be picked up by the nozzle A or B in the mounting pattern, a nozzle C which picks up the next part C and replaces the nozzle A is attached to the working head "a", while a nozzle D which picks up a part D and replaces the nozzle B is attached to the working head "b". The parts C and D are mounted in the positions C and D of the first childboard again according to the mounting pattern. The parts C and D are repeatedly and similarly mounted on the second through fourth childboards by referencing the offset values. As described above, since a nozzle is replaced after all of parts which can be picked up the attached nozzle are sequentially mounted on all of childboards, the part mounting process for a next part is repeatedly and similarly performed.

2 Claims, 6 Drawing Sheets

PART MOUNTING DEVICE, PART MOUNTING METHOD, AND STORAGE MEDIUM STORING PROGRAM THEREOF

BACKGROUND OF THE INVENTION

1. Field of the Invention

The present invention relates to a part mounting device for mounting electronic parts on a multi-sectional motherboard, a part mounting method, and a storage medium storing a program thereof.

2. Description of the Related Art

Conventionally, there was a part mounting device for mounting electronic parts (simply referred to as parts hereinafter) on a print circuit board (simply referred to as a board hereinafter) to be conveyed into the device by using a working head which can freely move upward and downward and is attached to a working tower which can freely move back and forth and to the left and right in a working space above the board. In recent years, the working tower has been normally attached with two or more working heads (currently, up to 8 is general) for improving an operation efficiency. The above described board includes various types such as a large-sized board on which approximately 100 parts are mounted, or a small-sized board on which parts whose number is a relatively small number such as several tens or ten-odd are mounted, etc.

If small-sized boards are conveyed one by one and parts are mounted thereon, a tact (ratio of the number of parts to be mounted on one board per hour) is degraded. This is because a considerable amount of time is required for conveying the boards and determining the positions of the boards. Therefore, a motherboard (multi-sectional board) is structured by connecting a plurality of such small-sized boards (childboards), for example, four or six boards; this motherboard is conveyed and mounted with parts; and the motherboard, for which this mounting process is completed and which is taken out, is cut into respective childboards in these days.

Similar to the case where parts are mounted on a normal single board, a working head sequentially completes a process for mounting parts on a first childboard, next on a second childboard, then on a third childboard, etc. according to a part mounting pattern corresponding to each of the childboards also in the case where parts are mounted on the above described motherboard. In this case, the working head performs the part mounting process by replacing a currently attached picking-up nozzle (simply referred to as a nozzle hereinafter) with a nozzle suitable for the type of a part to be mounted.

However, the above described nozzle replacement process must be performed with such a procedure that the working head returns the nozzle attached so far to a predetermined position (the position in which the nozzle is held before being attached) of a nozzle replacing device, then moves to the position in which the nozzle suitable for the part to be picked up is held, and attaches the desired nozzle. Therefore, the amount of time required for this procedure is much more than that required for the process for picking up parts and mounted them on a board. As a result, it prevents the tact from being improved. However, since the nozzle replacement process is essential, almost no consideration has been given to the way of improving the tact, which relates thereto, up to now.

SUMMARY OF THE INVENTION

The present invention was developed in the above described background, and aims at providing a part mounting device for improving the efficiency of a part mounting process for a multi-sectional board, a method thereof, and a storage medium storing a program thereof.

One aspect of the invention is directed to a part mounting device for mounting electronic parts on a multi-sectional motherboard comprised of a plurality of mechanically connected childboards, using at least one working head to which are attached respective picking-up nozzles. A memory unit stores mounting patterns for the plurality of childboards, and associates the picking-up nozzles with the respective electronic parts that can be mounted thereby. A processing unit extracts at least one mounting pattern for all parts to be mounted on the motherboard which are associated with a particular one of the picking-up nozzles. A working tower unit sequentially mounts all the parts which are associated with the particular picking-up nozzle on the plurality of childboards, without replacing the particular picking-up nozzle on the at least one working head, according to the at least one mounting pattern extracted by the processing unit. A control unit replaces the particular picking-up nozzle with a new picking-up nozzle on the at least one working head when all the parts associated with the particular picking-up nozzle have been mounted, activates the processing unit to extract at least one new mounting pattern of all the parts which are associated with the new picking-up nozzle, and activates the working tower unit to sequentially mount all of the parts which are associated with the new picking-up nozzle, without replacing the new picking-up nozzle on the at least one working head, according to the at least one extracted new mounting pattern.

As described above, according to the present invention, after all of parts which can be picked up by an attached nozzle are sequentially mounted on all of childboards, the nozzle is replaced. Then, the process for mounting a next part is repeatedly and similarly performed. Accordingly, the part mounting process with a plurality of working heads for a multi-sectional board can be performed by minimizing the nozzle replacement process, thereby significantly improving the efficiency of the part mounting process for a multi-sectional board in comparison with the conventional technique.

DESCRIPTION OF THE PREFERRED EMBODIMENT

Provided below is the explanation about the preferred embodiment according to the present invention, by referring to the drawings.

Figure 1A:
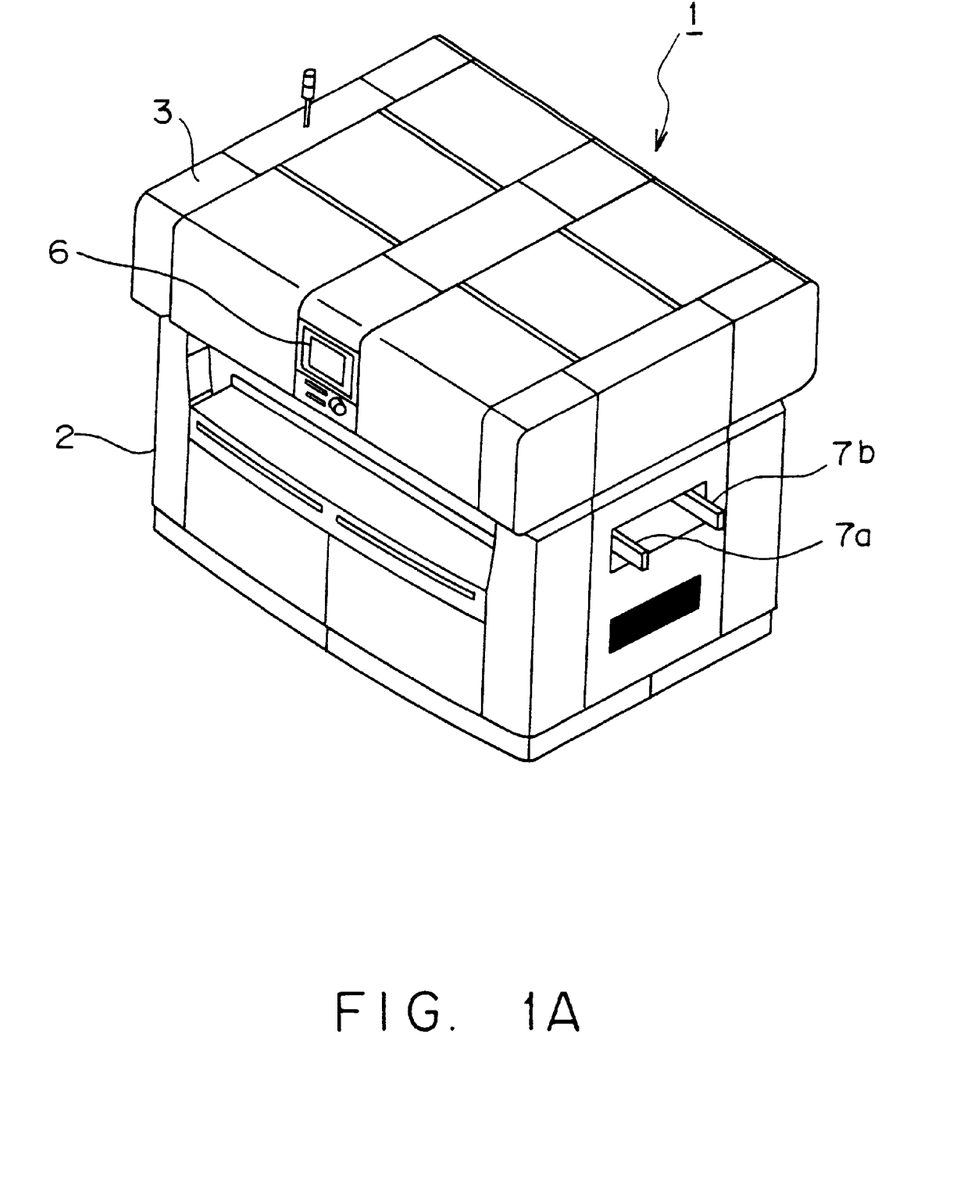
FIG. 1A is an oblique external view of a part mounting device according to a preferred embodiment.
Figure 1B:
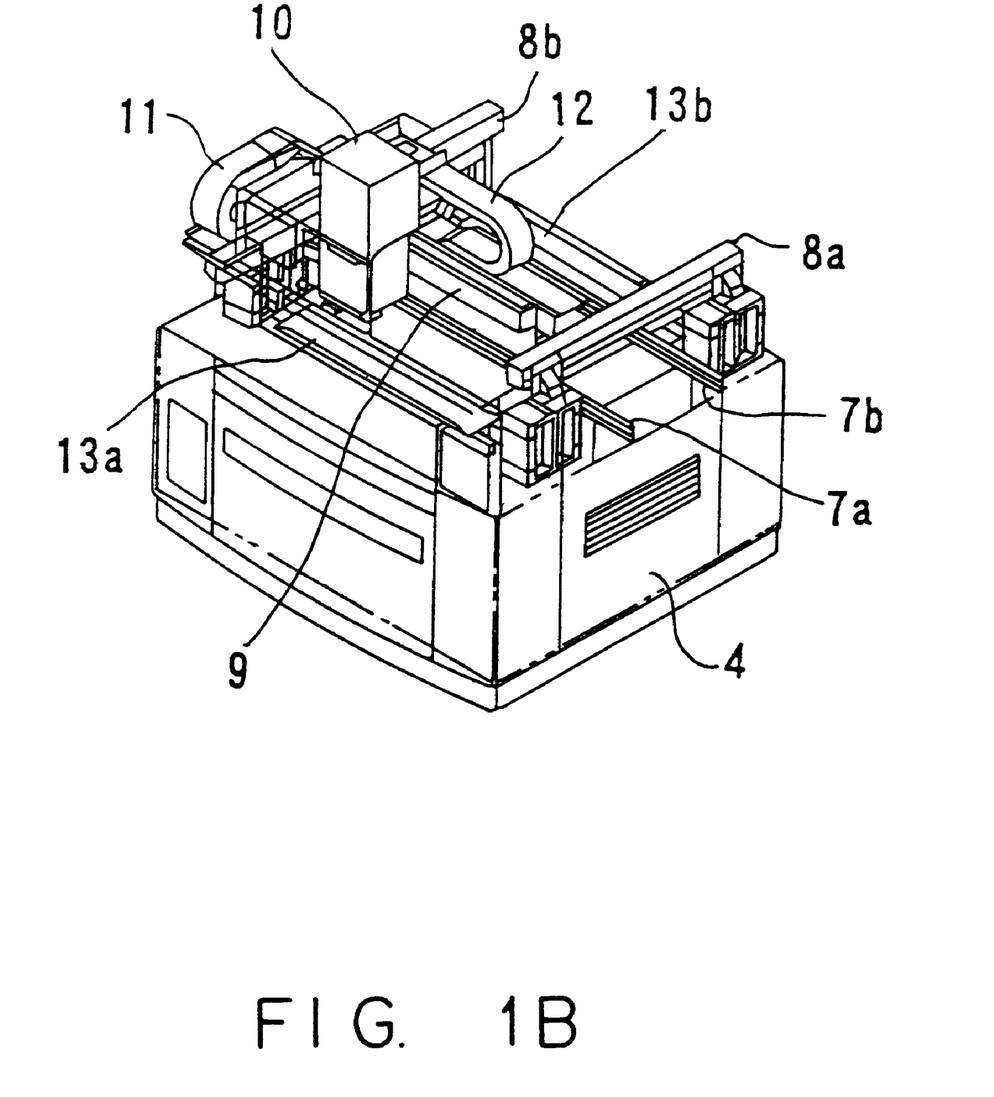
FIG. 1B is an oblique view of the part mounting device whose protection cover on the top is removed.
Figure 1C:
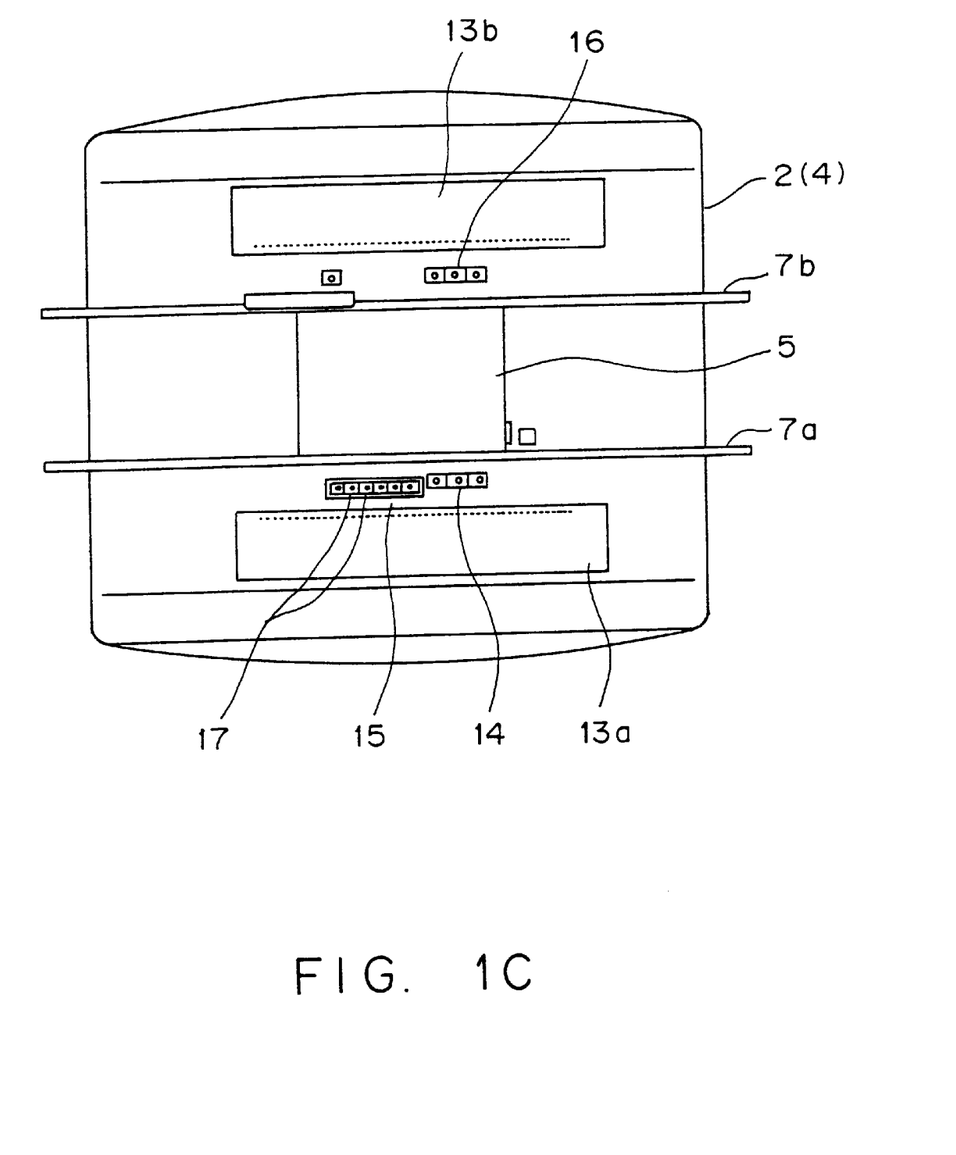
FIG. 1C is a top view showing components arranged directly on a chassis.

FIG. 1A is an oblique external view of a part mounting device according to a preferred embodiment. FIG. 1B is an oblique view of the part mounting device whose protection cover on the top is removed. FIG. 1C is a top view showing the components arranged directly on the chassis. This figure shows the device from which X and Y axes rails, a working tower, etc. which are arranged above the chassis as shown in FIG. 1B and will be described later, are removed.

As shown in FIGS. 1A, 1B, and 1C, the part mounting device (hereinafter referred to as a device) 1 is surrounded by a lower protection cover 2, comprises a chassis 4 whose upper portion is surrounded by an upper protection cover 3. Inside and onto the chassis 4, various types of components are arranged.

Inside the chassis 4, a support plate device 5 for supporting a board from the bottom, and a central controlling unit, which is not shown in this figure and will be described later, for controlling respective components. On the front side of the upper protection cover 3, an input device 6 composed of a liquid crystal display and a touch panel is arranged. Various types of instructions are externally input to the input device 6.

On the chassis 4, a pair of board guide rails 7a and 7b, one of which is fixed and the other of which is movable, are horizontally arranged in the conveyance direction of a board (in the X axis direction: in the direction obliquely from the lower right to the upper left in FIGS. 1A and 1B) in the center of the chassis 4. Contacting the lower portions of the board guide rails 7a and 7b are a plurality of loop-shaped conveyer belts, so that they are arranged to be able to run, although they are not shown in this figure. The sides of each of the conveyer belts, which are several-millimeter side, appear beneath the board guide rails 7a and 7b along the board conveying road. The conveyor belts are driven by a belt-driving motor, run in the board conveying direction, and convey a board while supporting both sides of the back of the board.

Straddling the pair of board guide rails 7a and 7b are a pair of parallel fixed rails (Y axis rails) 8a and 8b which are arranged in the direction perpendicular to the board conveying direction (the X axis direction). A long movable rail (X axis rail) 9 is installed to the Y axis rails 8a and 8b so that the rail can freely slide, and a working tower 10 for mounting parts on a board is attached with the X axis rail 9 so that the tower can freely move. The working tower 10 comprises two working heads which will be described in detail later.

On the chassis 4, a Y-axis-direction-driving servo motor, which freely rotates in the forward and backward directions according to an instruction from the central controlling unit, is arranged. With this motor, the X axis rail 9 moves in the forward and backward directions along the Y axis rails 8a and 8b via a driving transmission system. The X axis rail 9 is connected with a flexible cable 11.

The X axis rail 9 is arranged with an X-axis-direction driving servo motor, which freely rotates in the forward and backward directions according to an instruction from the central controlling unit. With this motor, the working tower 10 freely moves to the left and right (in the X axis direction) along the X axis rail 9 via another driving transmission system. The working tower 10 is connected with a flexible cable 12, and is connected to the central controlling unit via the cables 11 and 12. From the central controlling unit, electric power and a control signal are supplied via the cables 11 and 12. From the working tower 10 to the central controlling unit, the data (image data) for recognizing a target position to be worked on a board, etc. are transmitted.

In the front and the rear of the chassis 4, part cassette boards 13a and 13b are respectively arranged. Between the part cassette board 13a in the front and the fixed board guide rail 7a, three part recognition cameras 14 and a nozzle replacing device 15 are arranged. Also between the part cassette board 13b in the rear and the mobile board guide rail 7b, three part recognition cameras 16 are arranged.

On the board conveying road between the board guide rails 7a and 7b, the above described board support plate device 5 is arranged. This board support plate device 5 supports the board that the board guide rails 7a and 7b and the conveyer belts convey from a device at a preceding stage by raising the board from its bottom, and determines the position of the board by inserting position determination pin into board position determination hole.

At the tip of the working tower 10, two of working heads which pick up and mount parts and will be described later are arranged so that they can freely move upward and downward. Part tape cassettes corresponding to a plurality of types of parts to be mounted on the board are arranged beforehand so that they can be freely attached/detached to/from the part cassette boards 13a and 13b. The two working heads equipped to the working tower 10 pick up desired parts from the plurality of part tape cassettes and mount the parts on the board.

The nozzle replacing device 15 comprises a plurality of nozzles 17 (6 nozzles in this figure). The nozzles 17 having various tip sizes are held by the nozzle replacing device 15. The part recognition cameras 14 (or 16) stay on the route where each of the working heads of the working tower 10 picks up a part from a part tape cassette on the part cassette board 13a (or 13b) and moves it to the upper portion of the board; and detects a held position deviation by imaging the part picked up by each of the working head from the bottom.

Figure 2:
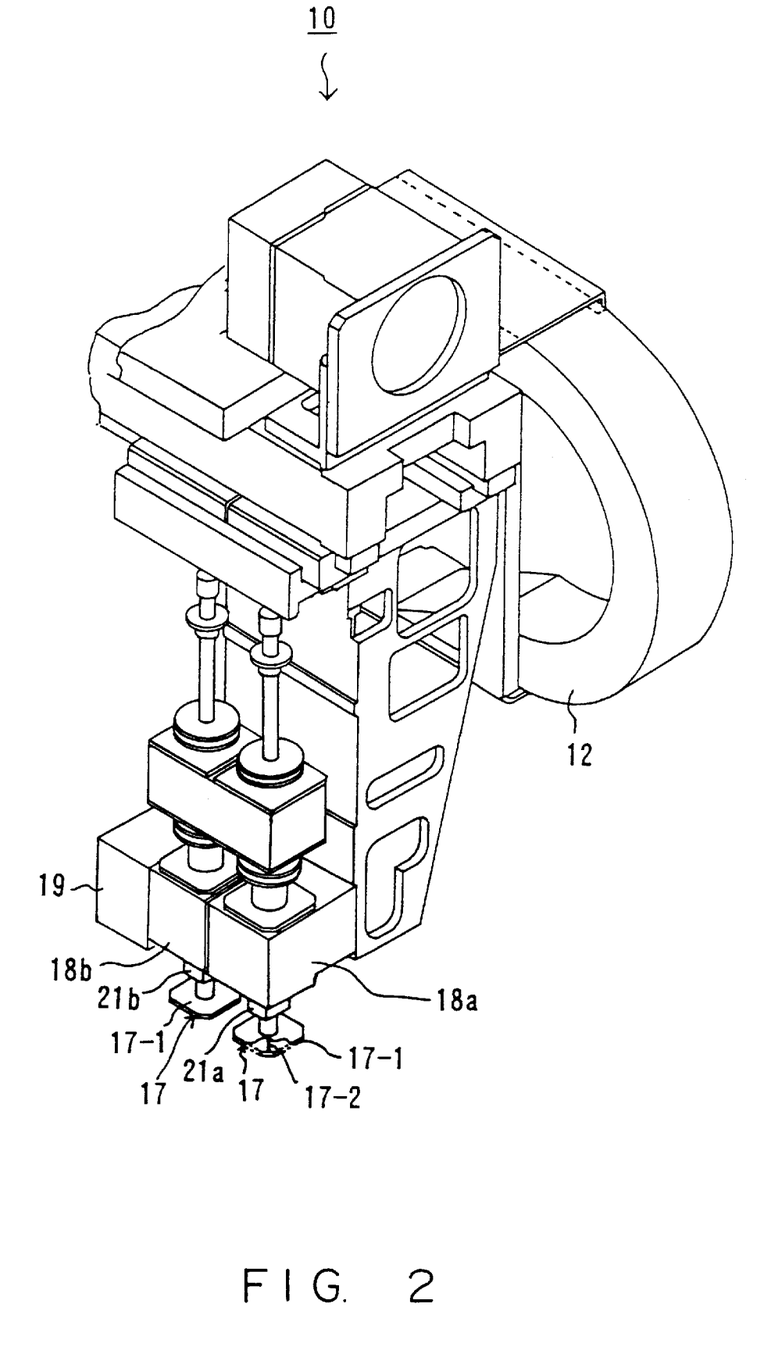
FIG. 2 is an oblique view of a working tower of the part mounting device.

FIG. 2 is an oblique view of the working tower 10. As shown in this figure, the working tower 10 is connected to the central controlling unit of the device by the flexible cable 12 in a belt state as described above. This working tower 10 comprises the two working heads 18a and 18b, and a head camera 19 for recognizing the position of a board at its tip. The working heads 18a and 18b comprise light-emitting units 21a and 21b, and nozzles 17 shown in FIG. 1C at its bottom so that the nozzles can be freely attached/detached to/from. Each of the nozzles 17 is composed of a light diffusing plate 17-1 for forming an image background of a part by diffusing an irradiation ray of the light emitting unit 21, and a nozzle unit 17-2 for picking up and move a part from a part tape cassette on the part cassette board 13 to a board.

Figure 3:
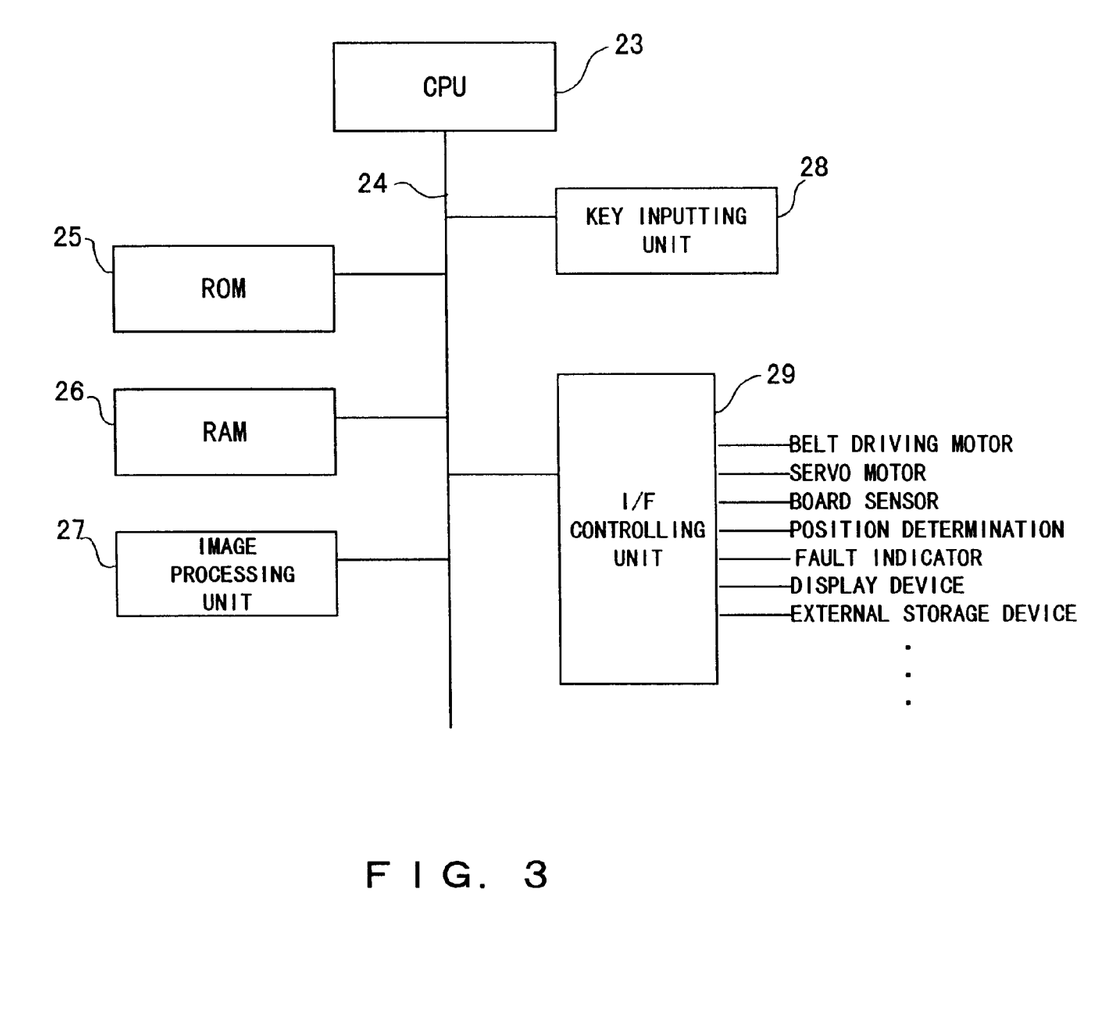
FIG. 3 is a block diagram showing the configuration of a central controlling unit arranged inside the chassis of the part mounting device.

FIG. 3 is a block diagram showing the configuration of the central controlling unit, which is arranged inside the chassis 4, for controlling the part mounting device having the above described configuration, and performing a part mounting process, particularly, a process for efficiently mounting parts on a multi-sectional board with a plurality of heads. In this figure, the central controlling unit includes a CPU (Central Processing Unit) 23 for controlling the entire device, to which a ROM (Read Only Memory) 25, a RAM (Random Access Memory) 26, an image processing unit 27, a key inputting unit 28, and an I/O controlling unit 29 are connected via a bus 24.

The ROM 25 stores a control or processing program, processing data of various types, etc. These program and data are read by the CPU 23, so that the efficient part mounting process is performed for a multi-sectional board to be described later. The RAM 26 includes a plurality of areas for storing the reference position data and offset value data of childboards beforehand, and a working area for temporarily storing deviation value data calculated based on image recognition and intermediate data which occurs during the calculation process, etc. These data are referenced or updated by the CPU 23.

The image processing unit 27 drives the part recognition cameras 14 and 16 shown in FIG. 1 and a board recognition camera 19 shown in FIG. 2; converts their image analog signals into digital signals; develops the digital signals as dot images in an internal memory; and transfers the images to the CPU 23. The key inputting unit 28 is connected to the input keys of the input device 6, and outputs an external operation signal from the input keys to the CPU 23.

The I/O controlling unit 29 is connected with various types of drivers such as a driver of a belt driving motor, which drives a conveyer belt, a driver of a servo motor, which drives the X and Y axes rails, a driver which drives a board sensor not shown in this figure, a driver of a cylinder, which raises and lowers the support plate device 5 and its position determination pin, a driver which drives a fault indicator (alarm indicator) of the input device 6, a driver which drives the liquid crystal display of the input device 6, a driver which drives an external storage device such as a floppy disk, an MD, etc., in order to read and write a program and data, etc.

Figure 4:
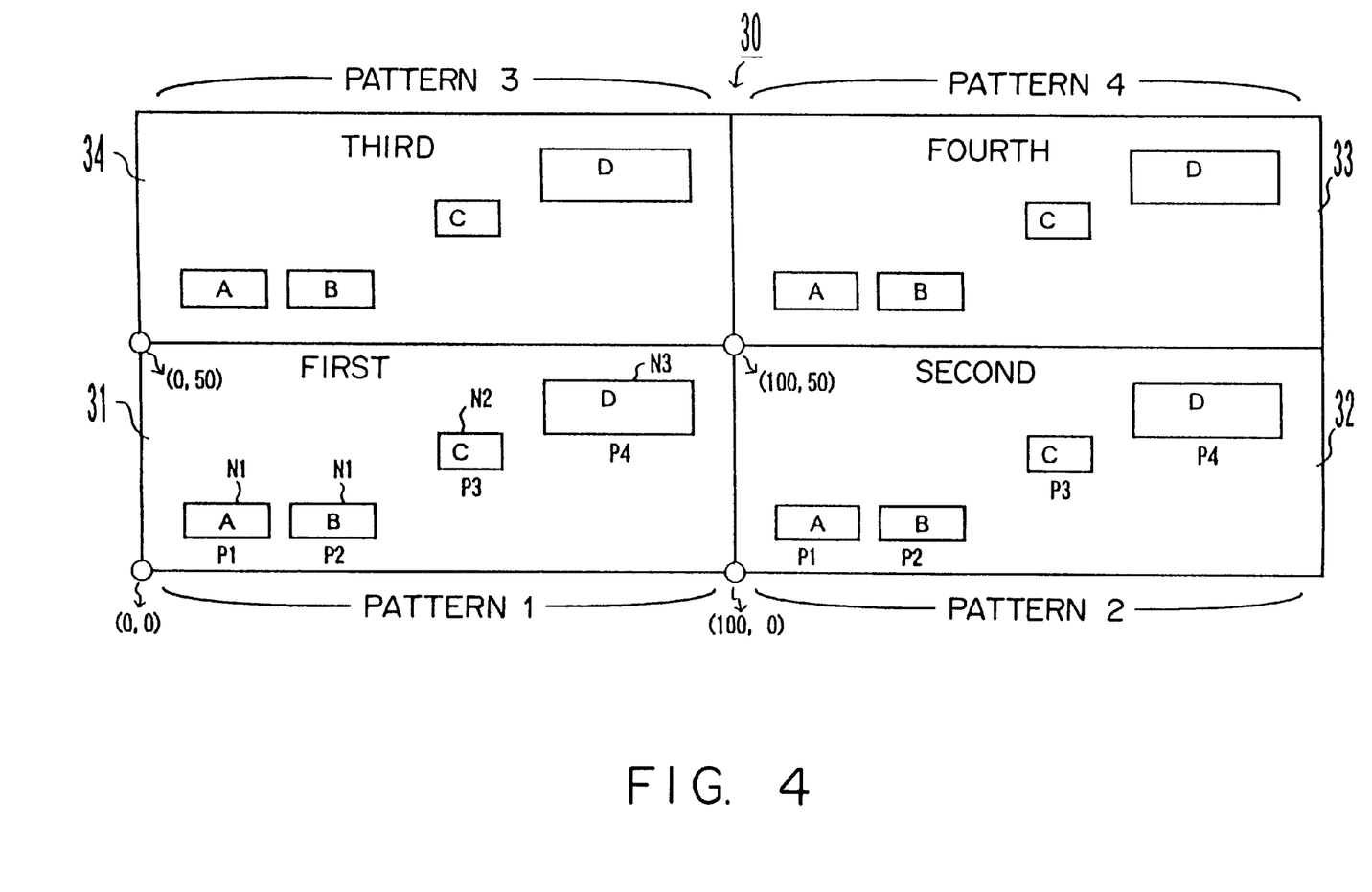
FIG. 4 shows a multi-sectional board.

FIG. 4 exemplifies a multi-sectional board. This figure shows a motherboard 30 composed of four childboards 31, 32, 33, and 34, which are connected in a four-section shape. The size of each of the childboards is 50 mm (in the X axis direction)×100 mm (in the Y axis direction). Accordingly, the size of the motherboard 30 in the X and Y axes directions is 100 mm×200 mm (separation margins are ignored here)

The origin of the first childboard 31 is (0,0), which is the same as that of the motherboard 30. Therefore, as shown in FIG. 4, the origin of the second childboard 32 is the coordinate (100, 0) of the motherboard 30; the origin of the third childboard 33 is the coordinate (0, 50) of the motherboard 30; and the origin of the fourth childboard 34 is the coordinate (100, 50) of the motherboard 30.

For ease of explanation, the example shown in this figure assumes that four parts (A, B, C, and D) are mounted on one childboard. As shown in the childboard 31, the parts A and B are assumed to be parts to be picked up by a nozzle N1 of an identical type; the part C is assumed to be a part to be picked up by a nozzle N2 of another type; and the part D is assumed to be a part to be picked up by a nozzle N3 of a different type.

The part mounting patterns (1 through 4) of the childboards 31 through 34 are the same. Only the offset values of the mounting position data are different. The offset values are the coordinate values of the origins of the childboards 31 through 34 on the motherboard 30.

The process for mounting parts, which is performed by the CPU 23 shown in FIG. 3, in such a configuration will be explained below. First of all, a pattern 1 is registered to (stored in) the RAM 26. The pattern 1 is read from an external storage device as a table composed of a command and a parameter of a part mounting program. Then, the nozzle N1 is attached to the first working head 18a in order to pick up the part A. Similarly, the nozzle N1 is attached to the second working head 8b in order to pick up the part B.

Normally, the nozzle replacing device 15 includes nozzles of an identical type, which is most frequently used and whose number is the same as that of working heads, in most cases. Also in this case, the parts A and B are part types which are most frequently mounted on a board. Therefore, the nozzle N1 used in common is a nozzle type which is most frequently used. In such a case, nozzles whose number is the same as that of working heads (18a and 18b), that is, two N1 nozzles are normally included in the nozzle replacing device 15 beforehand.

Then, the nozzles N1s are respectively attached to the working heads 18a and 18b as described above, and the part mounting process is performed according to the mounting patterns. In the example shown in this figure, the mounting patterns mean that "the part A is mounted in a position P1 of the childboard 31" and "the part B is mounted in a position P2 of the childboard 31". With these patterns, the parts A and B are picked up from two part tape cassettes on the part cassette board 13a or 13b, and are mounted in the respective positions P1 and P2 of the childboard 31.

According to the preferred embodiment of the present invention, the parts A and B are again picked up from the part tape cassettes and mounted in the positions P1 and P2 of the childboard 32 by referencing the offset value of the childboard 32, following the above described process. This process is repeated also for the childboards 33 and 34 in a similar manner. Then, it is determined whether or not there is any other part which can be picked up by the nozzle N1 in the mounting pattern. If "YES", the agog corresponding part is sequentially mounted on each of the childboards in the same manner.

In the example shown in this figure, it is determined that there is no other part which can be picked up by the nozzle N1 in the pattern 1 except for the parts A and B. In this case, the nozzle N2 which picks up the next part C and replaces the nozzle 1 is attached to the first working head 18a. If there is no part type which can be picked up by the nozzle N2 in the mounting pattern, the nozzle N3 which picks up the next part D is attached to the second working head 18b.

Then, according to the mounting pattern, the parts C and D are picked up from the two part tape cassettes on the part cassette board 13a or 13b, and are mounted in the respective positions P3 and P4 of the childboard 31. Then, the parts C and D are again picked up from the part tape cassettes, and are mounted in the respective positions P3 and P4 of the next childboard 32 by referencing the offset value of the childboard 32. This process is repeated also for the childboards 33 and 34 in a similar manner.

As described above, the part mounting process is completed for the entire motherboard 30 by replacing a same nozzle only once.

Although the nozzle replacement process is a process for replacing the nozzles of the two working heads 18a and 18b, the moves of the working heads 18a and 18b for the nozzle replacement depend on the move of the working tower 10. Therefore, the nozzle replacement process of the two working heads 18a and 18b is considered to be a single process as the number of process times.

Conventionally, the above described process was repeated for each pattern of each childboard. Accordingly, if the above described example is implemented in a conventional manner, the nozzle replacement process for a same nozzle is to be made four times. According to the preferred embodiment of the present invention, however, the number of times that a same nozzle is replaced is only once, thereby significantly improving the efficiency of the part mounting process.

What is claimed is:

1. A part mounting device for mounting electronic parts on a multi-sectional motherboard, comprised of a plurality of mechanically connected childboards, using at least one working head to which are attached respective picking-up nozzles, the part mounting device comprising:

a memory unit for storing mounting patterns for the plurality of childboards, and associating the picking-up nozzles with the respective electronic parts that can be mounted thereby;

a processing unit for extracting at least one mounting pattern for all parts to be mounted on the motherboard which are associated with a particular one of said picking-up nozzles;

a working tower unit for sequentially mounting all the parts which are associated with the particular picking-up nozzle on the plurality of childboards, without replacing the particular picking-up nozzle on the at least one working head, according to the at least one mounting pattern extracted by said processing unit; and a control unit for replacing the particular picking-up nozzle with a new picking-up nozzle on the at least one working head when all the parts associated with the particular picking-up nozzle have been mounted, activating said processing unit to extract at least one new mounting pattern of all the parts which are associated with the new picking-up nozzle, and activating said working tower unit to sequentially mount all of the parts which are associated with the new picking-up nozzle, without replacing the new picking-up nozzle on the at least one working head, according to the at least one extracted new mounting pattern.

2. The part mounting device of claim 1, wherein said at least one mounting pattern is one mounting pattern for all of the childboards, and the parts are mounted by the working tower unit on all of the childboards by using a coordinate offset value corresponding to each of the plurality of childboards.

* * * * *